US011810942B2

(12) United States Patent
Lius et al.

(10) Patent No.: US 11,810,942 B2
(45) Date of Patent: Nov. 7, 2023

(54) X-RAY DETECTION DEVICE

(71) Applicant: InnoLux Corporation, Miao-Li County (TW)

(72) Inventors: Chandra Lius, Miao-Li County (TW); Kuan-Feng Lee, Miao-Li County (TW)

(73) Assignee: InnoLux Corporation, Miao-Li County (TW)

(*) Notice: Subject to any disclaimer, the term of this patent is extended or adjusted under 35 U.S.C. 154(b) by 0 days.

(21) Appl. No.: 17/853,942

(22) Filed: Jun. 30, 2022

(65) Prior Publication Data

US 2023/0033388 A1 Feb. 2, 2023

(30) Foreign Application Priority Data

Jul. 30, 2021 (CN) .......................... 202110871302.6

(51) Int. Cl.
*H01L 27/146* (2006.01)
*G01T 1/20* (2006.01)

(52) U.S. Cl.
CPC ...... *H01L 27/14663* (2013.01); *G01T 1/2018* (2013.01); *H01L 27/1462* (2013.01); *H01L 27/14616* (2013.01); *H01L 27/14685* (2013.01); *H01L 27/14689* (2013.01)

(58) Field of Classification Search
None
See application file for complete search history.

(56) References Cited

U.S. PATENT DOCUMENTS

2021/0405216 A1* 12/2021 Liang ................. H01L 27/1462
2023/0170432 A1* 6/2023 Tsai .................... H01L 31/1055
257/53

* cited by examiner

*Primary Examiner* — Edwin C Gunberg
(74) *Attorney, Agent, or Firm* — Winston Hsu

(57) ABSTRACT

An X-ray detection device includes a substrate, a first transistor disposed on the substrate and including a silicon semiconductor, a second transistor disposed on the substrate and including a metal oxide semiconductor, a sensor disposed on the first transistor and the second transistor and electrically connected to the first transistor and the second transistor, a first barrier layer disposed between the first transistor and the second transistor, and a second barrier layer disposed between the second transistor and the sensor. The X-ray detection device may further include a scintillator disposed on the sensor.

8 Claims, 10 Drawing Sheets

X-RAY DETECTION DEVICE

BACKGROUND OF THE DISCLOSURE

1. Field of the Disclosure

The present disclosure is related to an X-ray detection device, and more particularly to an X-ray detection device including semiconductor layers with different materials.

2. Description of the Prior Art

With the rapid development of technology, various imaging technologies of visible light and invisible light are both widely used in daily life. For example, medical personnel often use X-ray sensors to obtain images for medical behavior, or enterprises may use X-ray sensors to detect the quality of goods etc. A pixel array composed of transistors is often used as a main component of the conventional flat-type X-ray sensor. However, the semiconductor layers in the transistors may be affected by other subsequent processes or the characteristics of the films produced afterward, which will further affect the detection accuracy of the X-ray sensor. Therefore, how to design the element structure to provide an X-ray sensor with better sensing effect is still an issue that needs to be continuously studied in the industry.

SUMMARY OF THE DISCLOSURE

The present disclosure provides an X-ray detection device which has two transistors and one sensor, and the X-ray detection device further includes a first barrier layer and a second barrier layer. By disposing the barrier layers, the quality of the semiconductor layers of the transistors can be improved, and the electrical performance of the transistors can also be raised, so as to improve the detection effect and accuracy of the X-ray detection device.

The X-ray detection device provided by the present disclosure includes a substrate, a first transistor disposed on the substrate and including a silicon semiconductor, a second transistor disposed on the substrate and including a metal oxide semiconductor, a sensor disposed on the first transistor and the second transistor and electrically connected to the first transistor and the second transistor, a first barrier layer disposed between the first transistor and the second transistor, and a second barrier layer disposed between the second transistor and the sensor. The X-ray detection device may further include a scintillator disposed on the sensor.

These and other objectives of the present disclosure will no doubt become obvious to those of ordinary skill in the art after reading the following detailed description of the embodiment that is illustrated in the various figures and drawings.

DETAILED DESCRIPTION

Figure 1:
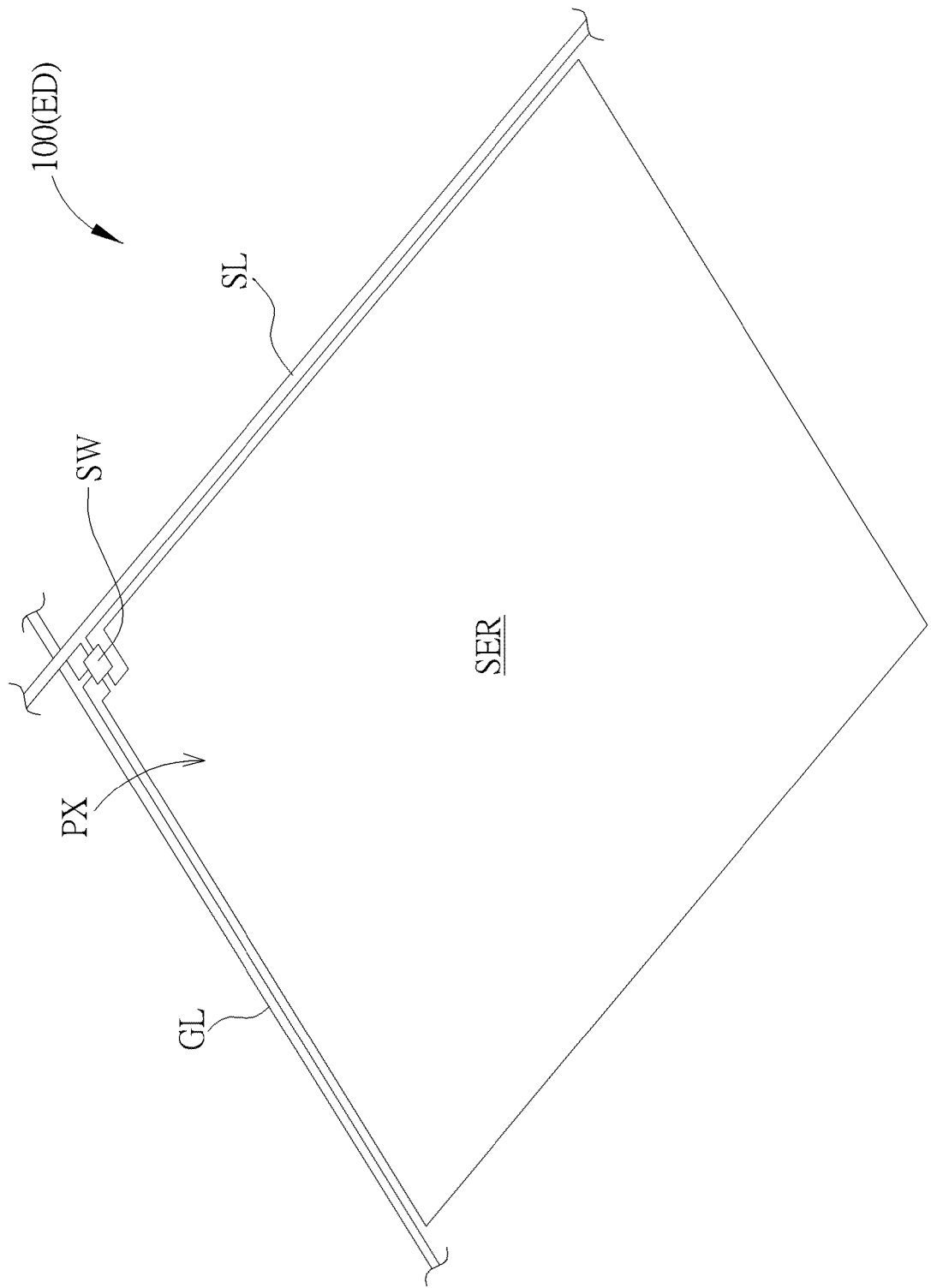
FIG. 1 is a partial schematic diagram of the element arrangement of an electronic device of the present disclosure.

The present disclosure may be understood by reference to the following detailed description of embodiments, taken in conjunction with the drawings as described below. It is noted that, for purposes of illustrative clarity and being easily understood by the readers, various drawings of this disclosure show a portion of the device or structure, and certain elements in various drawings may not be drawn to scale. In addition, the number and dimension of each element shown in drawings are only illustrative and are not intended to limit the scope of the present disclosure.

Certain terms are used throughout the description and following claims of the present disclosure for referring to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to". When the terms "comprising", "including" and/or "having" are used in this specification, they designate the presence of the stated feature, region, step, operation and/or element, but do not exclude the presence or addition of one or more other features, regions, steps, operations, elements and/or combinations thereof.

The ordinal terms used in the specification and claims, such as "first", "second", etc., are used for indicating elements in the claims. They do not imply and represent any sequential order in the claims, nor does it represent the order of a certain claimed element with respect to another claimed element, or the order of the manufacturing method. The use of these ordinal terms is only to clearly distinguish a claimed element with a certain name from another claimed element with the same name.

The directional terms mentioned in the embodiments, such as "up", "down", "left", "right", "front", "back", etc., are only directions referring to the drawings. Therefore, the directional terms used are for illustration, not for limitation of the present disclosure. It should be understood that the element particularly described or labeled in the drawings may be existed as various forms known by those skilled in the art. In addition, when an element or layer is referred to as being on or connected to another element or layer, it should be understood that the element or layer is directly on or connected to another element or on another layer, or there may be other elements or layers between the two (indirectly circumstance). However, on the contrary, when the element or layer is referred to being "directly on" or "directly connected to" another element or layer, it should be understood that no intervening elements or layers are existed therebetween. When the specification describes that a first device of the circuit is electrically connected to a second device, it refers to that the first device may be electrically connected to the second device directly, or the first device may be electrically connected to the second device indirectly. When the first device is electrically connected to the second device directly, the first device and the second device are connected through only conductive lines or passive elements (such as resistance and capacitor) and no other electric devices connect between the first device and the second device.

When the term "on" or "above" is mentioned, it includes the situation of direct contact or the situation that one or more other elements are intervened between two mentioned-elements, and in the latter situation, the two mentioned-elements may not be in contact with each other directly.

In the present disclosure, the thickness, the length, and the width may be measured by an optical microscopy (OM), and the thickness and the length may be measured through a cross-sectional image of a scanning electron microscope (SEM), but not limited thereto. In addition, some errors or inaccuracy may exist between any two values or directions used for comparison.

In the specification, the terms "about", "substantially", "around", and "approximately" generally mean within 10% of a given value or range, or mean within 5%, 3%, 2%, 1%, or 0.5% of a given value or range. A given quantity herein is an approximate quantity, that is, even in the situation of an absence of a specific description of "about", "substantially", "around", or "approximately", it may still imply the meaning of "about", "substantially", "around", or "approximately".

It should be noted that, from the described embodiments hereinafter and without departing from the spirit of the present disclosure, various features of different embodiments can be replaced, rearranged, or combined to accomplish other embodiments.

Referring to FIG. 1, FIG. 1 is a partial schematic diagram of the element arrangement of an electronic device of the present disclosure. As shown in FIG. 1, the present disclosure electronic device ED includes an X-ray detection device 100, wherein the X-ray detection device 100 may include a detection array composed of a plurality of sensing pixels, and FIG. 1 shows the arrangement of one sensing pixel PX. On sensing pixel PX may include one switch element SW and one sensor SER. The sensor SER is electrically connected to the switch element SW, and, for example, the switch element SW may be a transistor, such as a thin film transistor (TFT), including a gate, a drain, and a source, whose gate and drain may be electrically connected to a gate line GL and a signal line SL respectively. It should be noted that one single sensing pixel PX is not limited to including only one transistor. For example, one single sensing pixel PX may include two or three transistors, but the present disclosure is noted limited thereto. According to the present disclosure, the electronic device ED including the X-ray detection device 100 shown in FIG. 1 may be a medical X-ray camera as an example, but not limited thereto. In a variant embodiment, the electronic device ED may be a detector used for detecting the quality of products for instance. The sensor SER may be a photodiode as an example, but not limited thereto.

Figure 2:
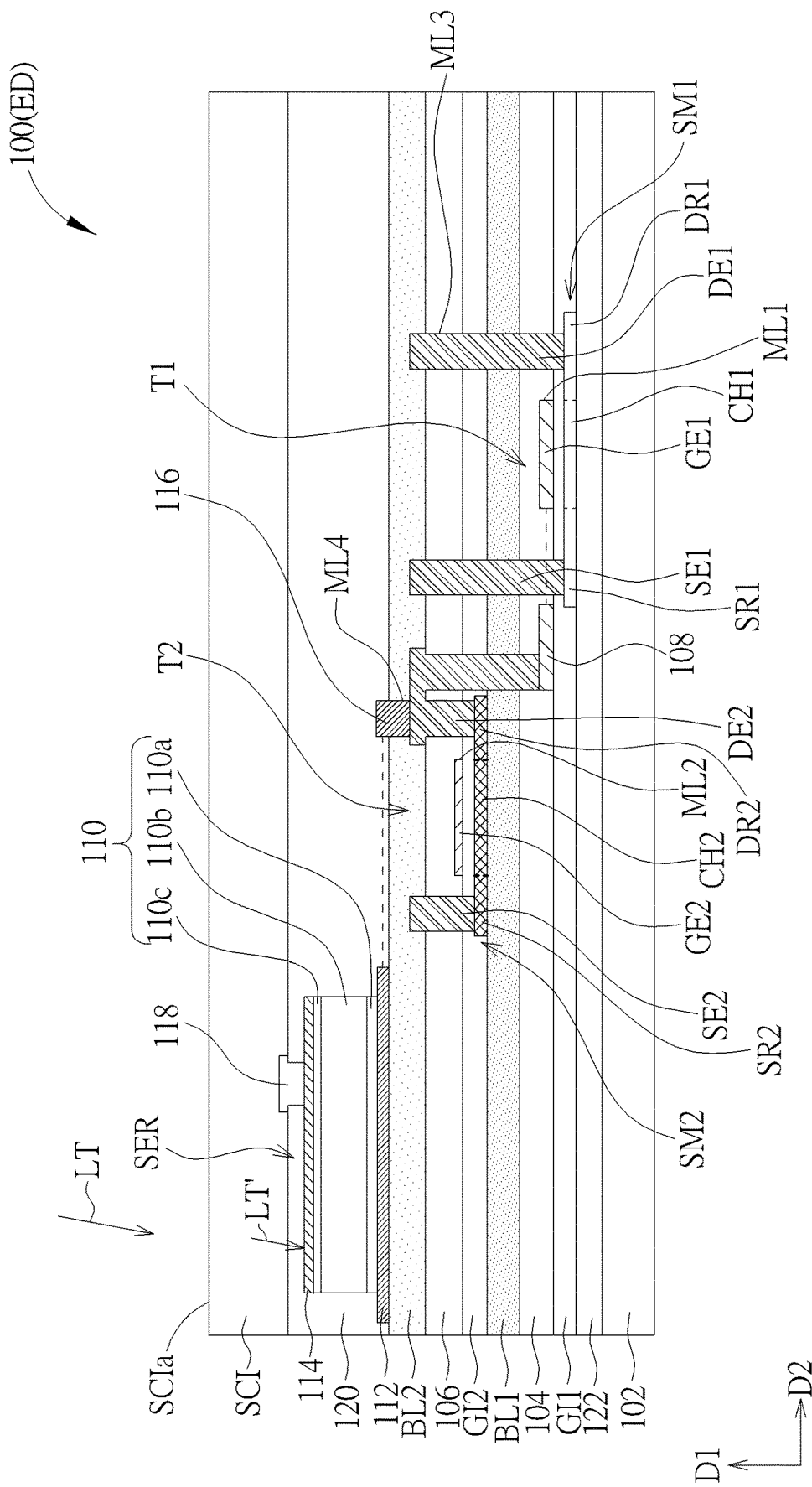
FIG. 2 is a partial cross-sectional schematic diagram of an X-ray detection device according to a first embodiment of the present disclosure.

Referring to FIG. 2, FIG. 2 is a partial cross-sectional schematic diagram of an X-ray detection device according to a first embodiment of the present disclosure. The present disclosure X-ray detection device 100 may be applied to an electronic device ED, and the partial element of the X-ray detection device 100 shown in FIG. 2 may correspond to one sensing pixel PX shown in FIG. 1 for example, but not limited thereto. In addition, each of the partial elements of the X-ray detection devices of other embodiments of the present disclosure shown in FIG. 3 to FIG. 9(A) may be considered as corresponding to one sensing pixel PX respectively, which will not be repeatedly described. The present disclosure X-ray detection device 100 includes a substrate 102 and includes a first transistor T1, a second transistor T2, a sensor SER, a scintillator SCI, a first barrier layer BL1, and a second barrier layer BL2 disposed on the substrate 102. The substrate 102 may for example include a rigid substrate, a flexible substrate, or a combination of the above-mentioned substrates, but not limited thereto. The material of the rigid substrate may for example include glass, ceramics, quartz, sapphire, or a combination of the materials mentioned above. The material of the flexible substrate may for example include polyimide (PI), polycarbonate (PC), polyethylene terephthalate (PET), other suitable material (s), or a combination of the materials mentioned above. It should be noted that although the substrate 102 shown in FIG. 2 is a single-layered structure, this embodiment is not limited thereto. In some embodiments, the substrate 102 may include a multi-layered structure, such as including a stacked structure formed of organic-layer/inorganic-layer/organic-layer. The first transistor T1 and the second transistor T2 include a gate (GE), a channel region (CH), a source region (SR), and a drain region (DR) respectively, wherein the source region SR and the drain region DR may serve as the source and the drain of the transistor respectively. The channel region CH, the source region SR, and the drain region DR may be formed by a semiconductor layer. The channel region CH is overlapped with the gate GE. In an embodiment, a conductive layer may be electrically connected to the source region SR and the drain region DR to form a source electrode (SE) and a drain electrode (DE) through two via holes respectively. The semiconductor layer may include silicon semiconductor, metal oxide semiconductor, other suitable materials, or a combination of the materials mentioned above, but the present disclosure is not limited thereto. Silicon semiconductor may include amorphous silicon semiconductor, single crystalline silicon semiconductor, poly-silicon semiconductor, or other suitable materials, and the present disclosure is not limited thereto. Metal oxide semiconductor includes indium gallium zinc oxide (IGZO) semiconductor or other suitable material(s), and the present disclosure is not limited thereto. In this embodiment, the semiconductor layer of the first transistor T1 may for example be a silicon semiconductor SM1 (such as a low-temperature polysilicon (LTPS) semiconductor layer), the semiconductor layer of the second transistor T2 may for example be a metal oxide semiconductor SM2 (such as an indium-gallium-zinc oxide semiconductor layer), and the present disclosure is not limited thereto. Wherein, the transistors may include bottom-gate type transistors, top-gate type transistors, double-gate type transistors, or a combination of the above-mentioned transistors, but the present disclosure is not limited thereto. In addition, when the transistors include different semiconductor layers, their sources and drains may be exchanged, and the present disclosure is not limited thereto. In the embodiment shown in FIG. 2, the silicon semiconductor SM1 is disposed between the metal oxide semiconductor SM2 and the substrate 102, the gate GE1 of the first transistor T1 is disposed between the gate GE2 of the second transistor T2 and the substrate 102, and the gate GE1 and the gate GE2 are formed by a first conductive layer ML1 and a second conductive layer ML2 respectively. The source region SR1 and the drain region DR1 of the first transistor T1 are disposed at two sides of the channel region CH1 and electrically connected to a source electrode SE1 and a drain electrode DE1 respectively, the source region SR2 and the drain region DR2 of the second transistor T2 are disposed at two sides of the channel region CH2 and electrically connected to a source electrode SE2 and a drain electrode DE2 respectively, and the source electrode SE1, the source electrode SE2, the drain electrode DE1, and the drain electrode DE2 may be formed by a same third conductive layer ML3, but not limited thereto. In a variant embodiment, for example, the source electrode SE1, the source electrode SE2, the drain electrode DE1, and the drain electrode DE2 may be formed by more than one conductive layer, or the gate GE1 and the gate GE2 may be formed by a same conductive layer. The first conductive layer ML1, the second conductive layer ML2, and the third conductive layer ML3 may include metal material (s) and may be a metal layer respectively, but not limited thereto. The source electrode SE1 and the drain electrode DE1 may penetrate through the first gate insulating layer GI1, the first insulating layer 104, the first barrier layer BL1, the second gate insulating layer GI2, and the second insulating layer 106, so as to connect with the source region SR1 and the drain region DR1 of the silicon semiconductor SM1. The source electrode SE2 and the drain electrode DE2 may penetrate through the second insulating layer 106 and the second gate insulating layer GI2, so as to connect with the source region SR2 and the drain region DR2 of the metal oxide semiconductor SM2, and a portion of the drain electrode DE2 may further penetrate through the first barrier layer BL1 and the first insulating layer 104 to connect with a connection element 108 and be electrically connected to the gate GE1 of the first transistor T1 through the connection element 108. The connection element 108 and the gate GE1 may be formed by the same first conductive layer ML1. In some embodiments, the connection element 108 may be connected to the gate GE1 directly, but not limited thereto. In FIG. 2, the first transistor T1 and the second transistor T2 may not be overlapped with each other in a first direction D1 that is in parallel with the normal direction of the surface of the substrate 102, which also means that the first transistor T1 and the second transistor T2 may be arranged side by side along a second direction D2 that is perpendicular to the first direction D1 of the normal line of the substrate 102. However, the relative arrangement positions between each component of the first transistor T1 and the second transistor T2 and between the two transistors of the present disclosure are not limited to the above-described structure. For example, in a variant embodiment, the first transistor T1 and the second transistor T2 may be at least partially overlapped in the first direction D1.

For example, the materials of the first gate insulating layer GI1, the first insulating layer 104, the second gate insulating layer GI2, and the second insulating layer 106 may include silicon oxide, but not limited thereto, and any suitable insulating material may be applied to the above-mentioned insulating layers. In a variant embodiment, the first insulating layer 104 may include silicon nitride with the advantage that silicon nitride includes hydrogen ions therein, wherein hydrogen ions are capable of diffusing into the silicon semiconductor SM1, which can improve the electrical performance of the first transistor T1.

The sensor SER is disposed on the first transistor T1 and the second transistor T2, and the sensor SER is electrically connected to the first transistor T1 and the second transistor T2. It should be noted that the sensor SER shown in FIG. 2 is not overlapped with the first transistor T1 or the second transistor T2 in the sectional view or in the first direction D1 of the substrate 102, but the structure of the present disclosure is not limited to the illustrated structure of FIG. 2. The description of "the sensor SER is disposed on the first transistor T1 and the second transistor T2" may include the situation that the sensor SER is at least partially overlapped with the first transistor T1 or the second transistor T2 or the situation that the sensor SER is not overlapped with the first transistor T1 nor the second transistor T2. In addition, the sensor SER for example may include a P-intrinsic-N (PIN) photodiode 110, such as an amorphous silicon photodiode, a polysilicon photodiode, a single crystalline silicon photodiode, or other suitable sensors, but not limited thereto. The PIN photodiode 110 may include an N-type semiconductor layer 110a, an intrinsic layer 110b, and a P-type semiconductor layer 110c, the bottom electrode 112 of the sensor SER is disposed at the lower side of the PIN photodiode 110, and the bottom electrode 112 may be electrically connected to the drain electrode DE2 of the second transistor T2 through the connection element 116, as shown in FIG. 2. The bottom electrode 112 and the connection element 116 may be formed by the same fourth conductive layer ML4, but the present disclosure is not limited thereto. For example, the bottom electrode 112 may be electrically connected to the second transistor T2 by other way or with other structure. The top electrode 114 of the sensor SER is disposed at the upper side of the PIN photodiode 110 and may be electrically connected to a connection element 118. The X-ray detection device 100 may selectively include a planarization layer 120 that covers the sensor SER, wherein a portion of the connection element 118 may be disposed on the planarization layer 120, and another portion of the connection element 118 may penetrate into a portion of the planarization layer 120 to electrically connect with the top electrode 114 of the sensor SER, but not limited thereto. The material of the planarization layer 120 may include acrylic-based polymer, siloxane-based polymer, epoxy-based polymer, other suitable materials, or a combination of the materials mentioned above, but the present disclosure is not limited thereto. The scintillator SCI is disposed on the sensor SER, such as being disposed on the planarization layer 120. The scintillator SCI is capable of transforming the X-ray that enters the X-ray detection device 100 into visible light or other kinds of light that can enable the sensor SER to produce photocurrent. As shown in FIG. 2, the scintillator SCI can transform X-ray into visible light, wherein the light LT representing the X-ray may enter the scintillator SCI from the front surface SCIa of the scintillator SCI, then be transformed into the light LT' representing visible light by the scintillator SCI, and the sensor SER is capable of receiving at least a part of the light LT'. The scintillator SCI may include microcoluminar thallium doped caesium iodide (CsI:Tl) for example, but not limited thereto. In addition, other layer(s) may be disposed between the scintillator SCI and the sensor SER, such as an insulating layer, a dielectric layer, and/or a metal thin-film, but the present disclosure is not limited thereto. In a variant embodiment, the X-ray detection device 100 may not include the scintillator SCI and the sensor SER may receive the light that enters from the exterior directly. The structures and relative disposition of the sensor SER and the scintillator SCI of the present disclosure are not limited to the above description and may be applied to other embodiments of the present disclosure, which will not be repeatedly described.

Furthermore, as shown in FIG. 2, the first barrier layer BL1 is disposed between the first transistor T1 and the second transistor T2, and the second barrier layer BL2 is disposed between the second transistor T2 and the sensor SER, wherein the first transistor T1 and the second transistor T2 may be or not be overlapped with each other in the first direction D1. The first barrier layer BL1 and the second barrier layer BL2 include insulating materials. For example, the first barrier layer BL1 may include silicon oxide (SiOx), and the second barrier layer BL2 may include silicon oxide, silicon nitride (SiNx), silicon oxynitride, or a combination thereof, but not limited thereto. It should be noted that the first barrier layer BL1 and the second barrier layer BL2 are different from each other by at least one of the parameters including film material, density, thickness, process condition (such as process temperature), hydrogen concentration, and etc. By the variation design of these parameters, the present disclosure enables the first barrier layer BL1 and the second barrier layer BL2 to have different properties, so as to improve the sensing performance of the X-ray detection device 100. The parameter ranges and design reasons of the first barrier layer BL1 and the second barrier layer BL2 will be described in detail below.

According to the present disclosure, since the first transistor T1 includes the silicon semiconductor SM1, the hydrogen ions of the first insulating layer 104 are capable of differing to the silicon semiconductor SM1 when the first insulating layer 104 has a higher hydrogen concentration, which can improve the property of the silicon semiconductor SM1. For example, the first insulating layer 104 may include silicon nitride or silicon oxide with higher hydrogen concentration. In another aspect, in order to mitigate the hydrogen ions of the first insulating layer 104 from differing into the metal oxide semiconductor SM2 of the second transistor T1 to influence its semiconductor property, the first barrier layer BL1 is designed to be disposed between the first transistor T1 and the second transistor T2 according to the present disclosure. For example, the first barrier layer BL1 may be disposed between the silicon semiconductor SM1 and the metal oxide semiconductor SM2, or disposed between the first insulating layer 104 and the metal oxide semiconductor SM2 (or the second transistor T2), so as to mitigate the situation that the hydrogen ions of the first insulating layer 104 differ into the metal oxide semiconductor SM2. As a result, the first barrier layer BL1 should have the properties of a lower hydrogen concentration and a higher film density in comparison with the first insulating layer 104. For example, the first barrier layer BL1 may have a higher process temperature with the range from 300° C. to 360° C., a hydrogen concentration with the weight percentage range from 2% to 5%, such as 2%, 2.5%, 3%, 4%, or 5%, and a thickness range from about 80 nanometers (nm) to about 200 nm, such as 80 nm, 120 nm, or 150 nm, but the film parameters of the first barrier layer BL1 are not limited to the above description.

In another aspect, silane (SiH4) gas will be introduced during the fabrication process of the sensor SER. In order to mitigate the influence on the metal oxide semiconductor SM2, the second barrier layer BL2 of the present disclosure also has a certain parameter condition. For example, compared with the first barrier layer BL1, the second barrier layer BL2 should have the properties of a lower process temperature, a lower density, and/or a higher hydrogen concentration. In other words, the hydrogen concentration of the second barrier layer BL2 is greater than the hydrogen concentration of the first barrier layer BL1, the density of the first barrier layer BL1 is greater than the density of the second barrier layer BL2, and the thickness of the first barrier layer BL1 is less than the thickness of the second barrier layer BL2. As an example, the range of the process temperature of the second barrier layer BL2 is from about 180° C. to about 240° C., the density of the second barrier layer BL2 is lower than the density of the first barrier layer BL1 by about 0.1-1.0 g/cm$^3$, the range of the hydrogen concentration of the second barrier layer BL2 is from about 5% to about 11%, such as 5%, 6%, 7%, 8%, 9%, 10%, or 11%, and the range of the film thickness of the second barrier layer BL2 is from about 200 nm to about 500 nm, such as 200 nm, 250 nm, 300 nm, 400 nm, or 500 nm, but each parameter of the second barrier layer BL2 of the present disclosure is not limited to the above-mentioned examples.

The above-mentioned film thicknesses may be measured through X-ray reflection (XRR) method or by a transmission electron microscopy (TEM), but the present disclosure is not limited thereto. X-ray reflection method may be carried out by using a high resolution X-ray diffraction analyzer (HRXRD) to measure the target, such as (but not limited to) using Bruker Discover tool, which can measure the thickness, interface roughness, and electron density of the multi-layer/single-layer film samples by using the characteristic of total reflection of X-ray. For example, when measuring the density of the film, the thickness of the sample may be 300 nm or less, and in the case of the sample being in a cross section, the density of the film can be obtained by taking a point from the middle of the film to measure. The above-mentioned thickness may also be measured by TEM. For example, the thickness of the film may be directly measured from the TEM section photography diagram. The measuring point may be determined from any position of the barrier layer corresponding to the semiconductor layer. The measurement of the above-mentioned hydrogen concentration of the film may be carried out for example by using an X-ray photoelectron spectroscopy (XPS) or an electron spectroscopy for chemical analysis (ESCA), or through Time of Flight—the secondary ion mass spectrometry (TOF-SIMS) method or hydrogen forward scattering (HFS) method. The TOF-SIMS method may for example adopt (but not limited to) a nanoTOF II tool, wherein bismuth ($Bi^{3+}$) ion beam can be provided, and then the generated secondary ions, resulted from the ion beam, of the sample can be analyzed and measured. In the HFS method, the tool of ERDA is exemplified (but not limited thereto), such as providing a helium ($He^{++}$) ion beam to the film, and then analyzing and measuring the diffusing hydrogen ions or helium ions of the sample generated by the bombardment of the ion beam. In the XPS/ESCA analyzing method, the tool of ESCALAB Xi+ is exemplified (but not limited thereto), wherein the X-ray is enabled to enter the sample surface, and the escaping electron energy from the sample surface is captured, so as to calculate the hydrogen concentration. The measurement methods of the density, the thickness, and the hydrogen concentration of films of the present disclosure are not limited to the above description.

In addition, the present disclosure X-ray detection device 100 may further include an insulating layer 122 disposed between the substrate 102 and the first transistor T1. The hydrogen concentration of the insulating layer 122 may be greater than the hydrogen concentration of the second barrier layer BL2, and may also be greater than the hydrogen concentration of the first barrier layer BL1. The density of the insulating layer 122 may be less than the density of the first barrier layer BL1. The insulating layer 122 may serve as a buffer layer, and when fabricating the silicon semiconductor layer SM1, the continuous diffusion of moisture or oxygen permeating through the substrate 102 can be reduced, thereby reducing the effect of the moisture or oxygen on the properties of the transistors. The insulating layer 122 may be a single-layered structure or a multi-layered structure, and is not limited to the one layer structure shown in FIG. 2. When the insulating layer 122 is a single-layered structure, the material of the insulating layer 122 may for example include silicon oxide, silicon nitride, silicon oxynitride, or a combination thereof, but not limited thereto. When the insulating layer 122 is a multi-layered structure, different materials may be stacked alternately, but the present disclosure is not limited thereto.

According to the present disclosure, the disposition of the first barrier layer BL1 is capable of mitigating the situation that the hydrogen ions in the films therebelow diffuse into the metal oxide semiconductor SM2, thus its undesired effect on the metal oxide semiconductor SM2 may be reduced. The disposition of the second barrier layer BL2 is also capable of mitigating the problem that the hydrogen ions diffuse into the metal oxide semiconductor SM2 when fabricating the sensor SER. Therefore, when the first barrier layer BL1 and the second barrier layer BL2 are disposed, the electrical performance of different transistors may be improved. In another aspect, the present disclosure X-ray detection device 100 includes transistors having semiconductors with different materials, thus they may be used as different electric elements of the sensing pixel PX based on their property or characteristic respectively, so as to increase the sensing effect of the sensing pixel.

It should be noted that FIG. 2 only exemplarily shows the cross-sectional structure of the partial elements of the first embodiment of the X-ray detection device of the present disclosure, and the X-ray detection device of the present disclosure is not limited to FIG. 2. Other embodiments and variant embodiments of the X-ray detection device of the present disclosure will be introduced in the following. In order to simplify the description, the same films or elements in the following embodiments will be marked with the same labels and their features will not be repeated, and the differences between the embodiments will be described in detail below.

Figure 3:
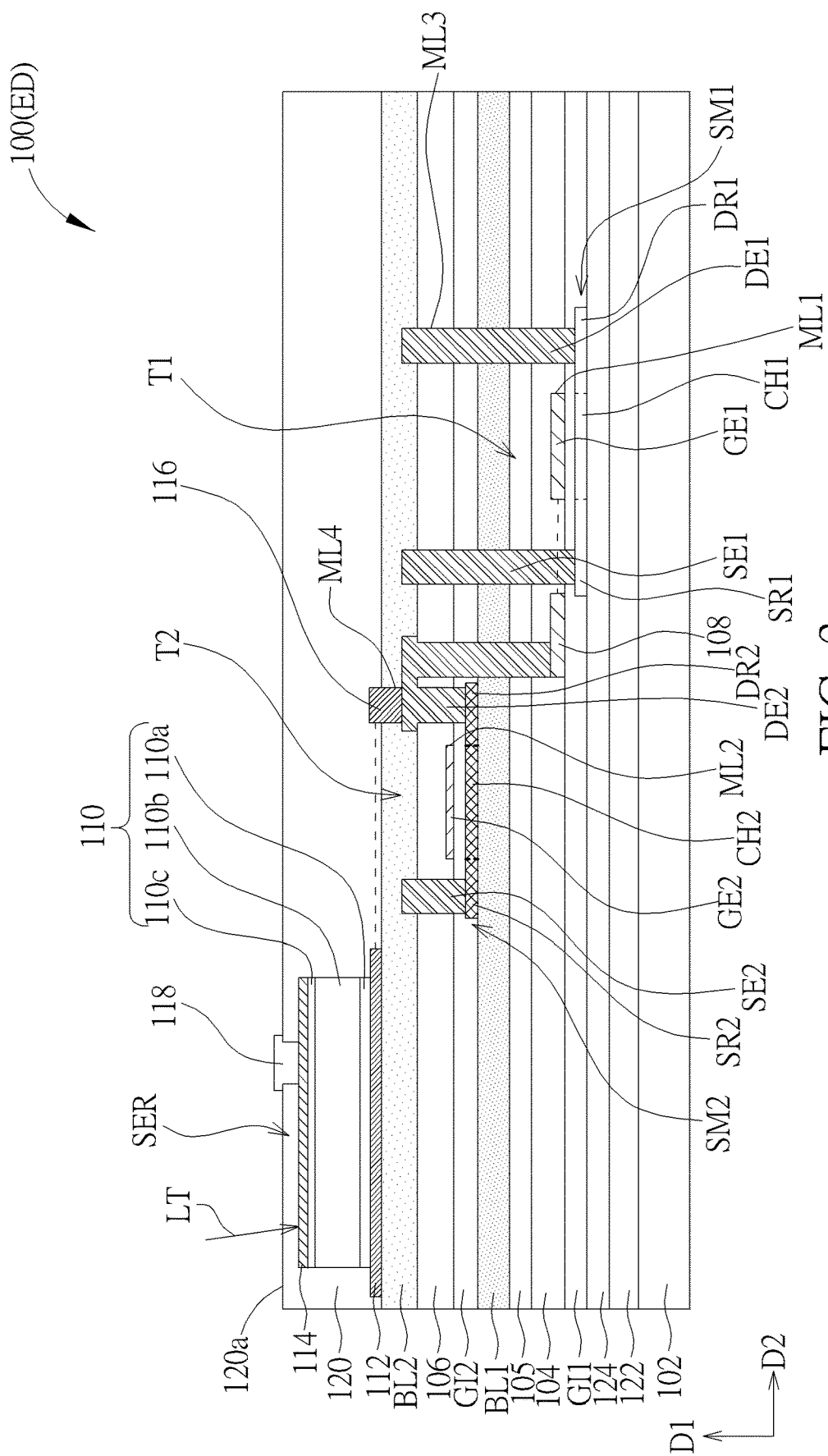
FIG. 3 is a partial cross-sectional schematic diagram of an X-ray detection device according to a second embodiment of the present disclosure.

Referring to FIG. 3, FIG. 3 is a partial cross-sectional schematic diagram of an X-ray detection device according to a second embodiment of the present disclosure. This embodiment and the first embodiment is different in that the X-ray detection device 100 in FIG. 3 includes two insulating layers disposed between the silicon semiconductor SM1 and the metal oxide semiconductor SM2 and includes two buffer layers disposed between the substrate 102 and the silicon semiconductor SM1. As shown in FIG. 3, the first insulating layer 104 and the third insulating layer 105 are disposed on the silicon semiconductor SM1 in order, which can serve as the interlayer dielectric layers. The source electrode SE1 and the drain electrode DE1 formed by the third conductive layer ML3 may penetrate through the first insulating layer 104 and the third insulating layer 105. As an example, the material of the first insulating layer 104 may include silicon oxide, and the material of the third insulating layer 105 may include silicon nitride, but not limited thereto. The materials of the first insulating layer 104 and the third insulating layer 105 may be exchanged. When the first insulating layer 104 or the third insulating layer 105 includes silicon nitride, its hydrogen ions may diffuse downward into the silicon semiconductor SM1 to improve the electrical performance of the first transistor T1. In addition, the insulating layer 122 and the insulating layer 124 are disposed between the first transistor T1 and the substrate 102, which may provide the buffering function to reduce the moisture and/or oxygen permeating from the lower side of the substrate 102. The materials of the insulating layer 122 and the insulating layer 124 may for example include silicon oxide, silicon nitride, silicon oxynitride, or a combination thereof, but not limited thereto. The insulating layer 122 and the insulating layer 124 may include different materials. For example, the insulating layer 122 may include silicon nitride and the insulating layer 124 may include silicon oxide, but not limited thereto. The hydrogen concentration of the insulating layer 124 may be greater than the hydrogen concentration of the second barrier layer BL2. The dispositions and materials of the first insulating layer 104, the third insulating layer 105, the insulating layer 122, and the insulating layer 124 of this embodiment may be applied to other embodiments, which will not be repeatedly described. Furthermore, at the upper side of the sensor SER, the scintillator SCI (not shown) may be omitted in the X-ray detection device 100 shown in FIG. 3, and the light LT may enter the sensor SER from an upper surface 120a of the planarization layer 120, wherein the light LT may be a visible light or any kind of light that is capable of enabling the sensor SER to produce photocurrent. It should be notated that a variant embodiment of this embodiment may still include a scintillator SCI disposed at the upper side of the sensor SER and/or an insulating layer disposed between the scintillator SCI and the sensor SER. The above-mentioned scintillator SCI and the insulating layer disposed between the scintillator SCI and the sensor SER may be applied to other following embodiments of the present disclosure, whose functions and materials may refer to the first embodiment and will not be repeated.

Figure 4:
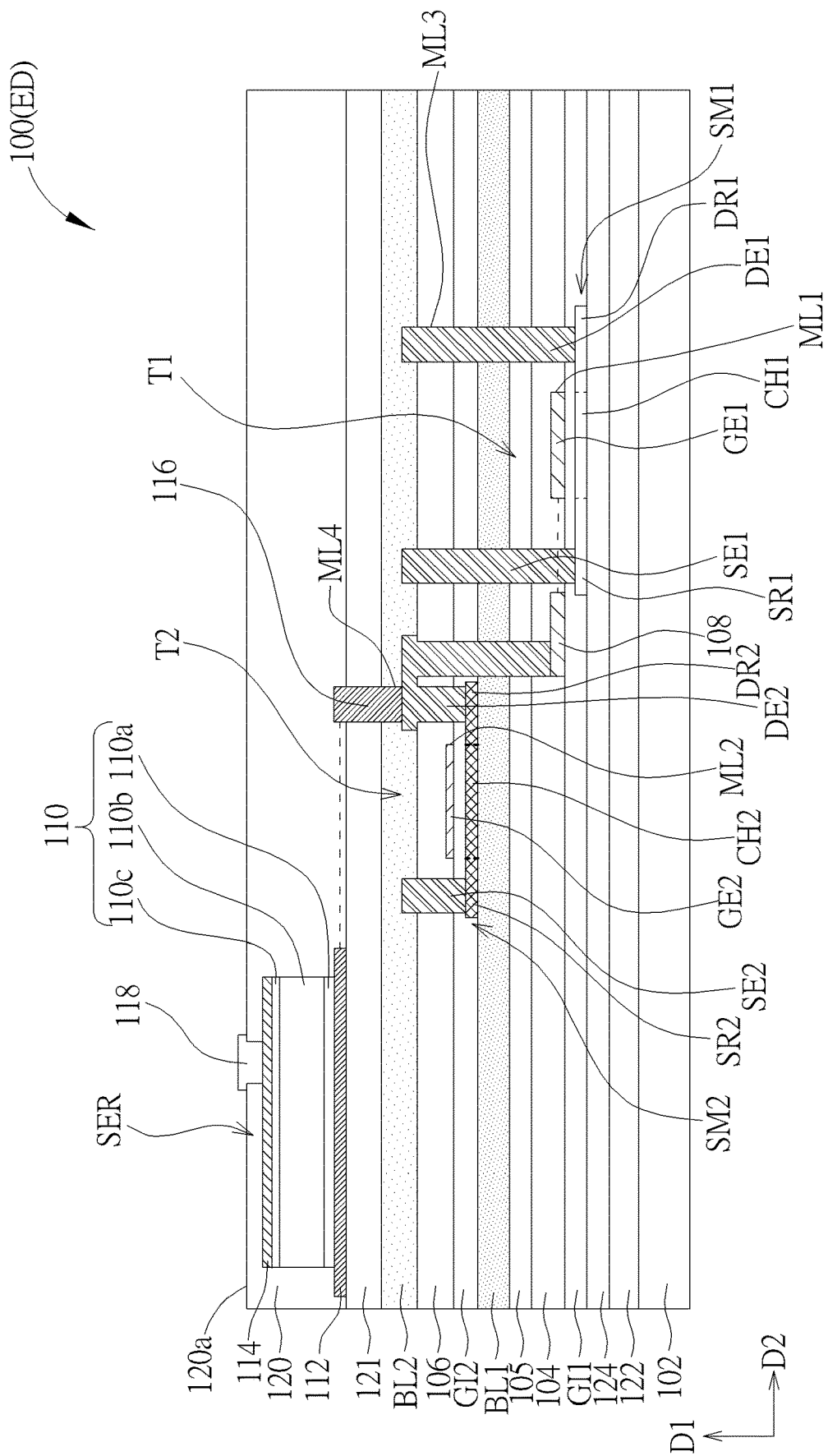
FIG. 4 is a partial cross-sectional schematic diagram of an X-ray detection device according to a third embodiment of the present disclosure.

Referring to FIG. 4, FIG. 4 is a partial cross-sectional schematic diagram of an X-ray detection device according to a third embodiment of the present disclosure. In comparison with the embodiment shown in FIG. 3, the X-ray detection device 100 shown in FIG. 4 further includes a planarization layer 121 disposed between the sensor SER and the second barrier layer BL2. The disposition of the planarization layer 121 may provide a planar surface, which may improve the fabrication process and/or property of the sensor SER. Furthermore, although the insulating layers and barrier layers shown in FIG. 4 have flat upper surfaces and lower surfaces, in fact, these insulating layers or barrier layers may follow the pattern of the patterned layers or electric elements on their lower side conformally, and therefore they may undulate to have uneven upper surfaces. The planarization layer 121 disposed on the second barrier layer BL2 in this embodiment is capable of providing a flatter upper surface, such that the sensor SER may be disposed on a flatter surface. The planarization layer 121 may include the material(s) as previously mentioned for the planarization layer 120, and the material of the planarization layer 121 may be the same as or different from the planarization layer 120.

Figure 5:
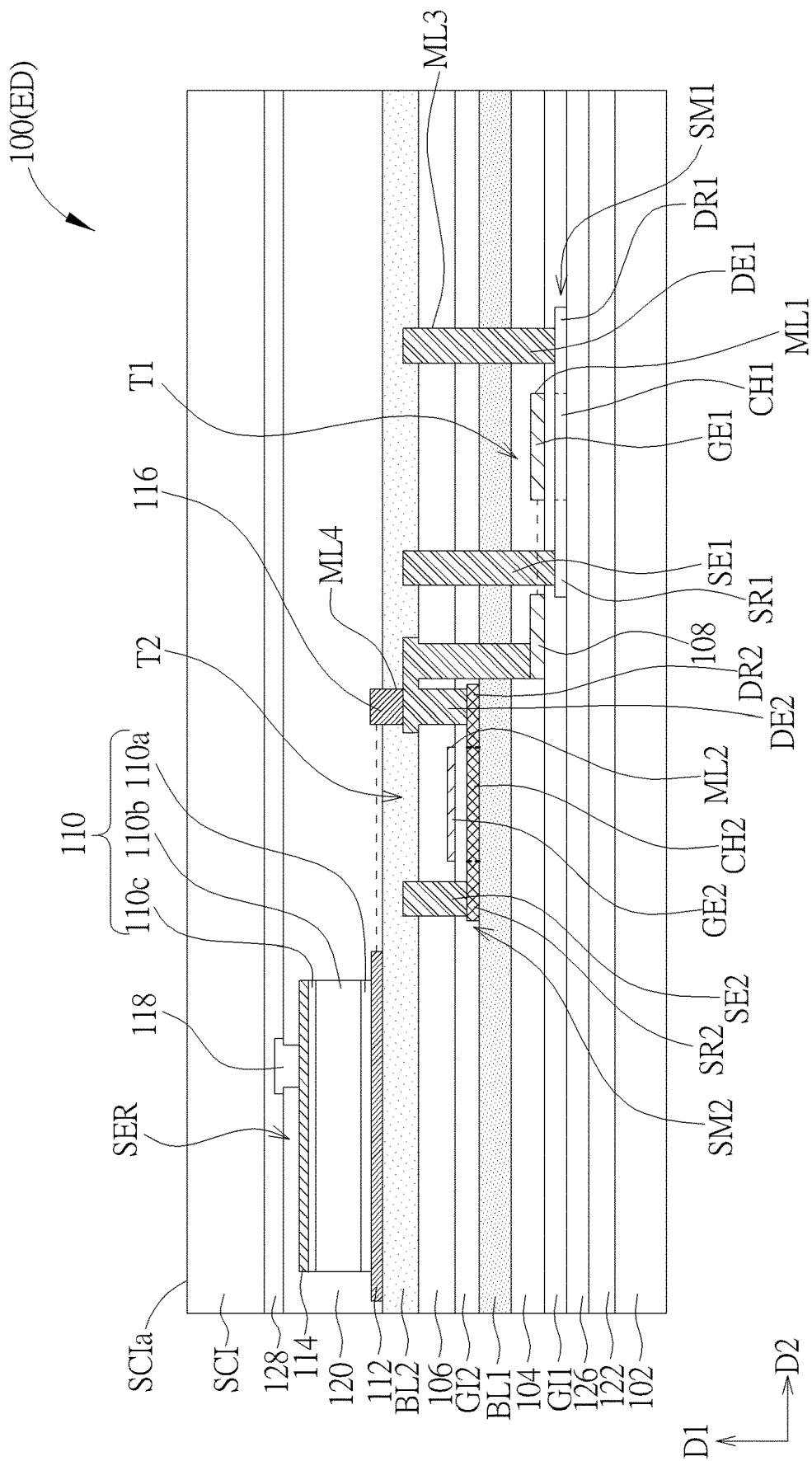
FIG. 5 is a partial cross-sectional schematic diagram of an X-ray detection device according to a fourth embodiment of the present disclosure.

Referring to FIG. 5, FIG. 5 is a partial cross-sectional schematic diagram of an X-ray detection device according to a fourth embodiment of the present disclosure. In comparison with FIG. 2 and FIG. 3, the X-ray detection device 100 shown in FIG. 5 includes an insulating layer 126 disposed between the insulating layer 122 and the silicon semiconductor SM1, and the material of the insulating layer 126 may for example include silicon nitride, silicon oxide, silicon oxynitride, or a combination thereof, but not limited thereto. The insulating layer 126 is capable of reducing moisture and/or oxygen permeating from the lower side (i.e., the backside) of the X-ray detection device 100 or the substrate 102, thereby reducing the damage to the elements caused by moisture and/or oxygen. According to this embodiment, the hydrogen concentration of the insulating layer 126 is greater than the hydrogen concentration of the first barrier layer BL1, the density of the insulating layer 126 is less than the density of the first barrier layer BL1. When the hydrogen concentration of the insulating layer 126 is greater than the hydrogen concentration of the first barrier layer BL1 and the density of the insulating layer 126 is less than the density of the first barrier layer BL1, the moisture and/or oxygen permeating from the substrate 102 can be reduced, and the tact time can be reduced, so as to reduce fabrication cost. The insulating layer 126 in this embodiment may be applied to other embodiments of the present disclosure, which will not be repeatedly described. Furthermore, the X-ray detection device 100 shown in FIG. 5 may further include an insulating layer 128 disposed on the sensor SER, and the insulating layer 128 may include silicon nitride, silicon oxide, silicon oxynitride, or a combination thereof, but not limited thereto. The insulating layer 128 may serve as a third barrier layer to mitigate the permeation of moisture and/or oxygen from exterior, which means the moisture and/or oxygen permeating from the exterior of the X-ray detection device 100 (such as from the upper side of the X-ray detection device 100) can be reduced. According to this embodiment, when the hydrogen concentration of the insulating layer 128 is less than the hydrogen concentration of the second barrier layer BL2 and the density of the insulating layer 128 is greater than the density of the second barrier layer BL2, the insulating layer 128 is capable of reducing the permeation of moisture and/or oxygen. The insulating layer 128 in this embodiment may be applied to other embodiments of the present disclosure, which will not be repeatedly described.

Figure 6:
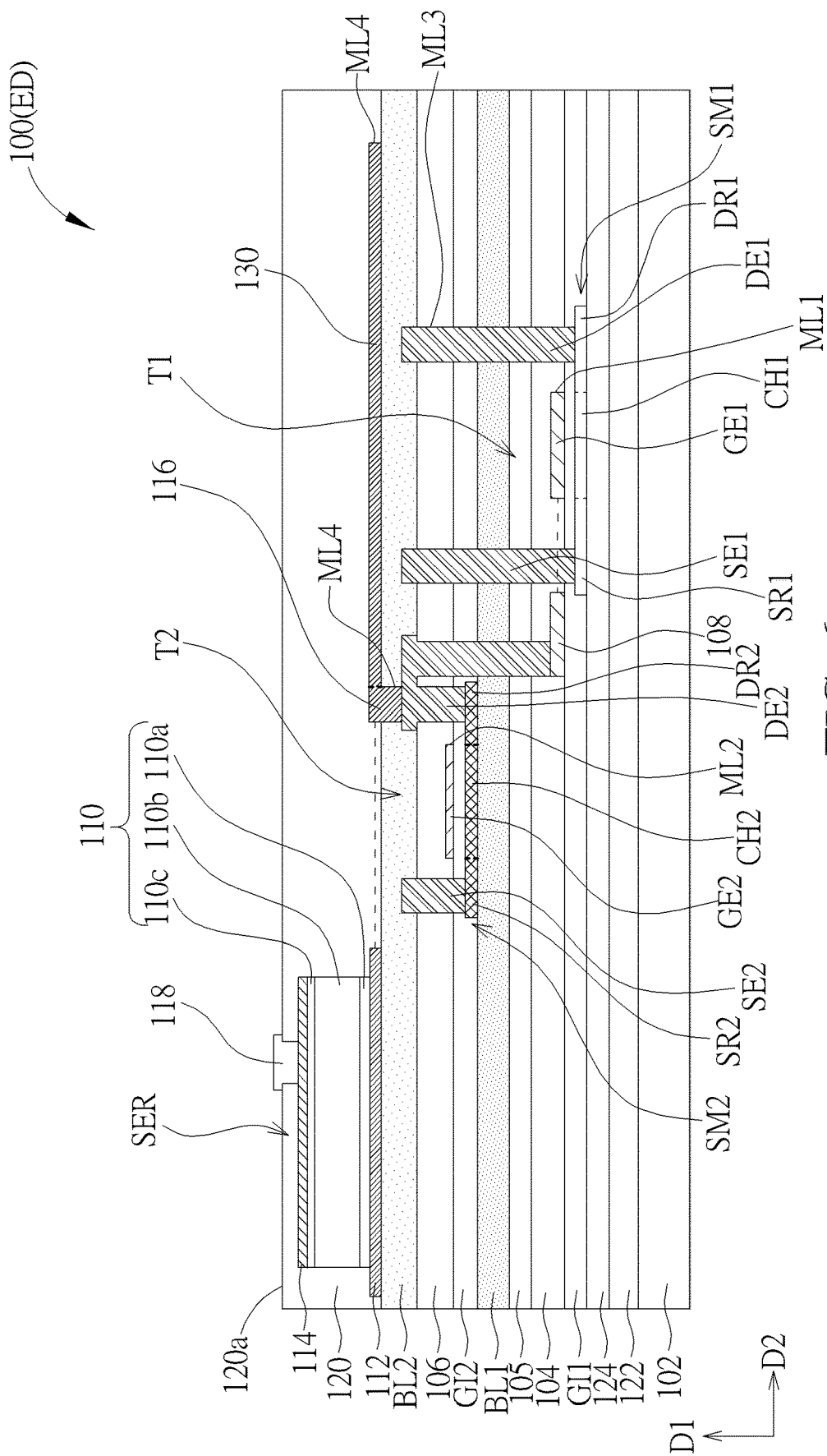
FIG. 6 is a partial cross-sectional schematic diagram of an X-ray detection device according to a fifth embodiment of the present disclosure.

Referring to FIG. 6, FIG. 6 is a partial cross-sectional schematic diagram of an X-ray detection device according to a fifth embodiment of the present disclosure. In comparison with the embodiment shown in FIG. 3, the X-ray detection device 100 shown in FIG. 6 further includes a light-shielding element 130 disposed between the planarization layer 120 and the second barrier layer BL2. For example, the light-shielding element 130 may be at least partially overlapped with the first transistor T1 or entirely overlap with the first transistor T1 in the first direction D1, which is capable of reducing light entering the first transistor T1 from the upper side of the X-ray detection device 100, so as to improve the electrical performance of the first transistor T1. The light-shielding element 130 and the bottom electrode 112 of the sensor SER may be formed by the same fourth conductive layer ML4, which means the light-shielding element 130 and the bottom electrode 112 of the sensor SER may be formed together by a same patterning process, but the present disclosure is not limited thereto. In FIG. 6, the light-shielding element 130 may be electrically connected to the connection element 116 directly, but the present disclosure is not limited thereto. In a variant embodiment, the light-shielding element 130 may not be electrically connected to the connection element 116, such as (but not limited to) that the light-shielding element 130 is floating. Since the fourth conductive layer ML4 has a farther distance from the first transistor T1, when the fourth conductive layer ML4 is used to form the light-shielding element 130, the coupling effect between the light-shielding element 130 and the first transistor T1 is less, thus the induced coupling capacitance is smaller and will less likely affect the property of the first transistor T1. The light-shielding element 130 of this embodiment may be applied to other embodiments of the present disclosure, which will not be repeatedly described.

Figure 7:
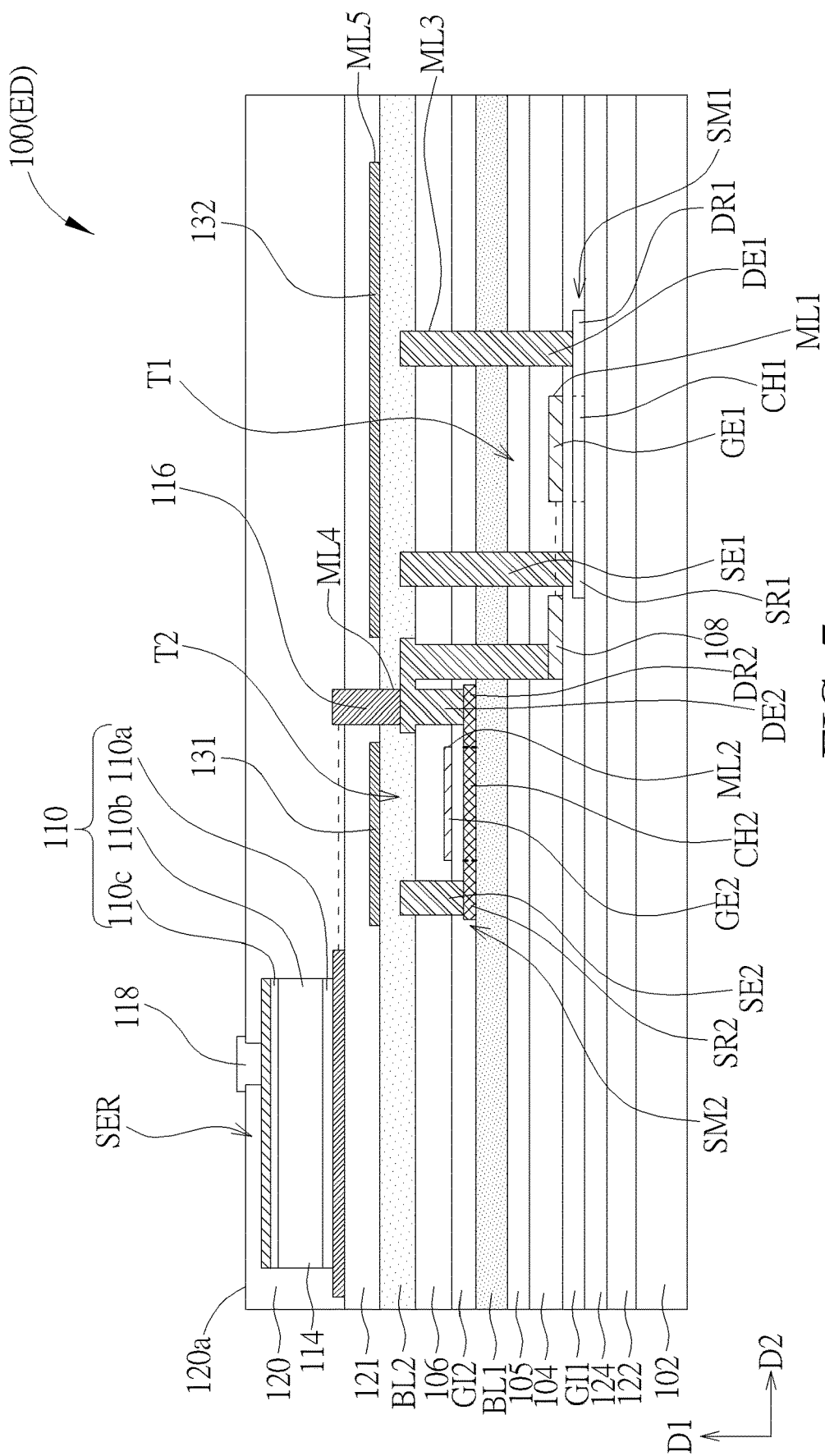
FIG. 7 is a partial cross-sectional schematic diagram of an X-ray detection device according to a sixth embodiment of the present disclosure.

Referring to FIG. 7, FIG. 7 is a partial cross-sectional schematic diagram of an X-ray detection device according to a sixth embodiment of the present disclosure. In comparison with the embodiment shown in FIG. 4, the X-ray detection device 100 shown in FIG. 7 further includes a light-shielding layer ML5 disposed between the planarization layer 121 and the second barrier layer BL2, wherein the patterned light-shielding layer ML5 may include a light-shielding element 131 and a light-shielding element 132 at least partially overlapped with the second transistor T2 and the first transistor T1 in the first direction D1 respectively. As an example, the light-shielding element 131 may be at least partially overlapped with metal oxide semiconductor SM2 in the first direction D1, and the light-shielding element 132 may be at least partially overlapped with the silicon semiconductor SM1 in the first direction D1. The light-shielding element 131 and the light-shielding element 132 may reduce or decrease the light entering from the upper side of the X-ray detection device 100, so as to lower the influence on the second transistor T2 and the first transistor T1 by light exposure. The light-shielding layer ML5 may include a conductive material, such as a metal layer, and at this time, the light-shielding element 131 and the light-shielding element 132 may be in a floating state without being electrically connected to other elements. The light-shielding layer ML5 may also include insulating material, such as polymer material or organic material including black pigment. In some embodiments, the light-shielding layer ML5 may be, for example, a black matrix layer. The material of the light-shielding layer ML5 is not limited to the above. The light-shielding layer ML5 in this embodiment may be applied to other embodiments of the present disclosure, which will not be repeatedly described.

Figure 8:
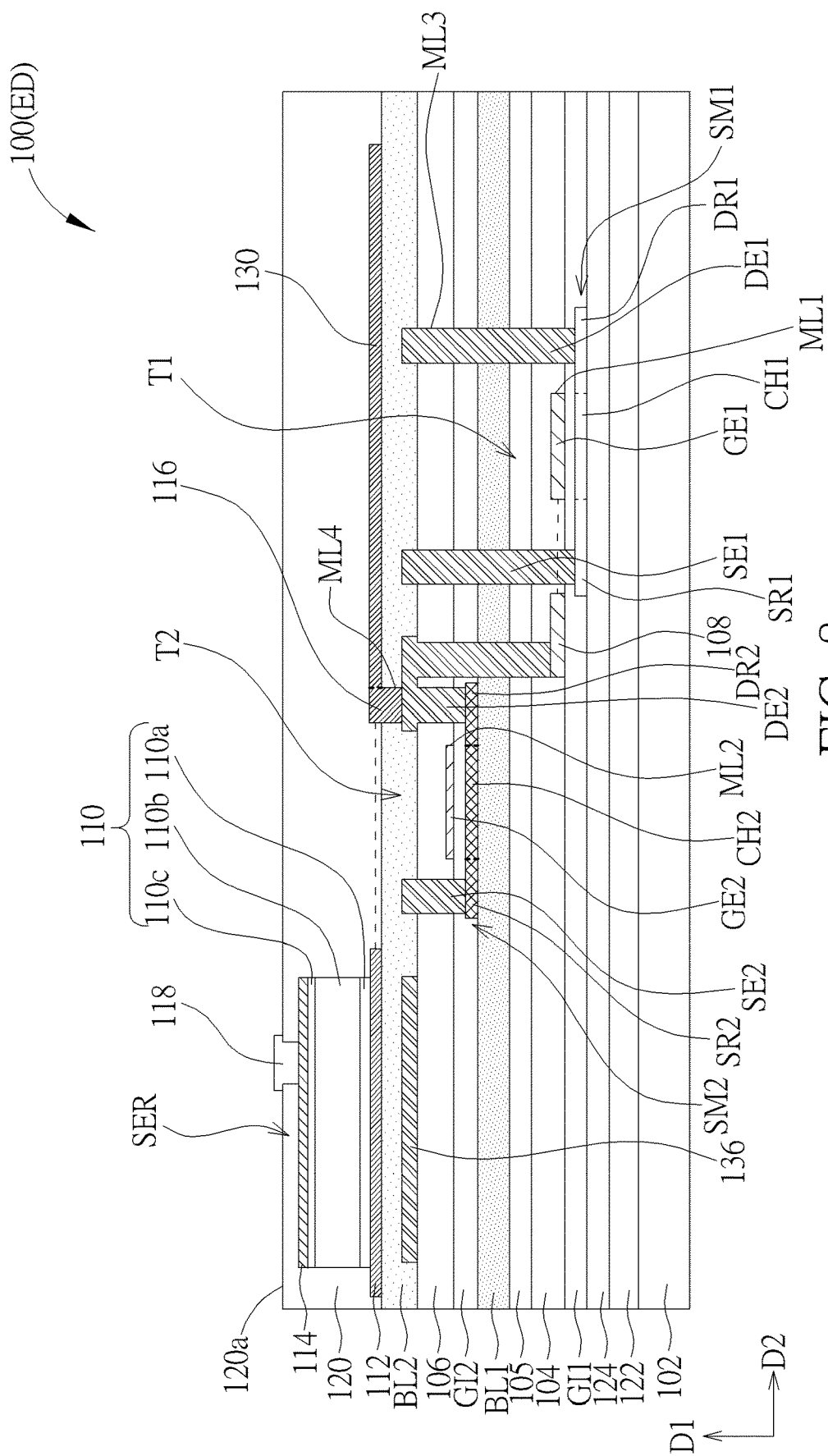
FIG. 8 is a partial cross-sectional schematic diagram of an X-ray detection device according to a seventh embodiment of the present disclosure.

Referring to FIG. 8, FIG. 8 is a partial cross-sectional schematic diagram of an X-ray detection device according to a seventh embodiment of the present disclosure. Compared with the structure shown in FIG. 6, the X-ray detection device 100 of FIG. 8 includes a capacitor electrode 136 disposed at the lower side of the bottom electrode 112 of the sensor SER, and the second barrier layer BL2 is disposed between the bottom electrode 112 and the capacitor electrode 136. As a result, the capacitor electrode 136, the bottom electrode 112, and the second barrier layer BL2 between the capacitor electrode 136 and the bottom electrode 112 may form a capacitor together. The capacitor electrode 136 in this embodiment may be formed by the third conductive layer ML3. The capacitor electrode 136 may be formed together when forming the source electrode SE1, the source electrode SE2, the drain electrode DE1, and the drain electrode DE2, but not limited thereto. The capacitor electrode 136 may be applied to other embodiments of the present disclosure, which will not be repeatedly described.

Figure 9A:
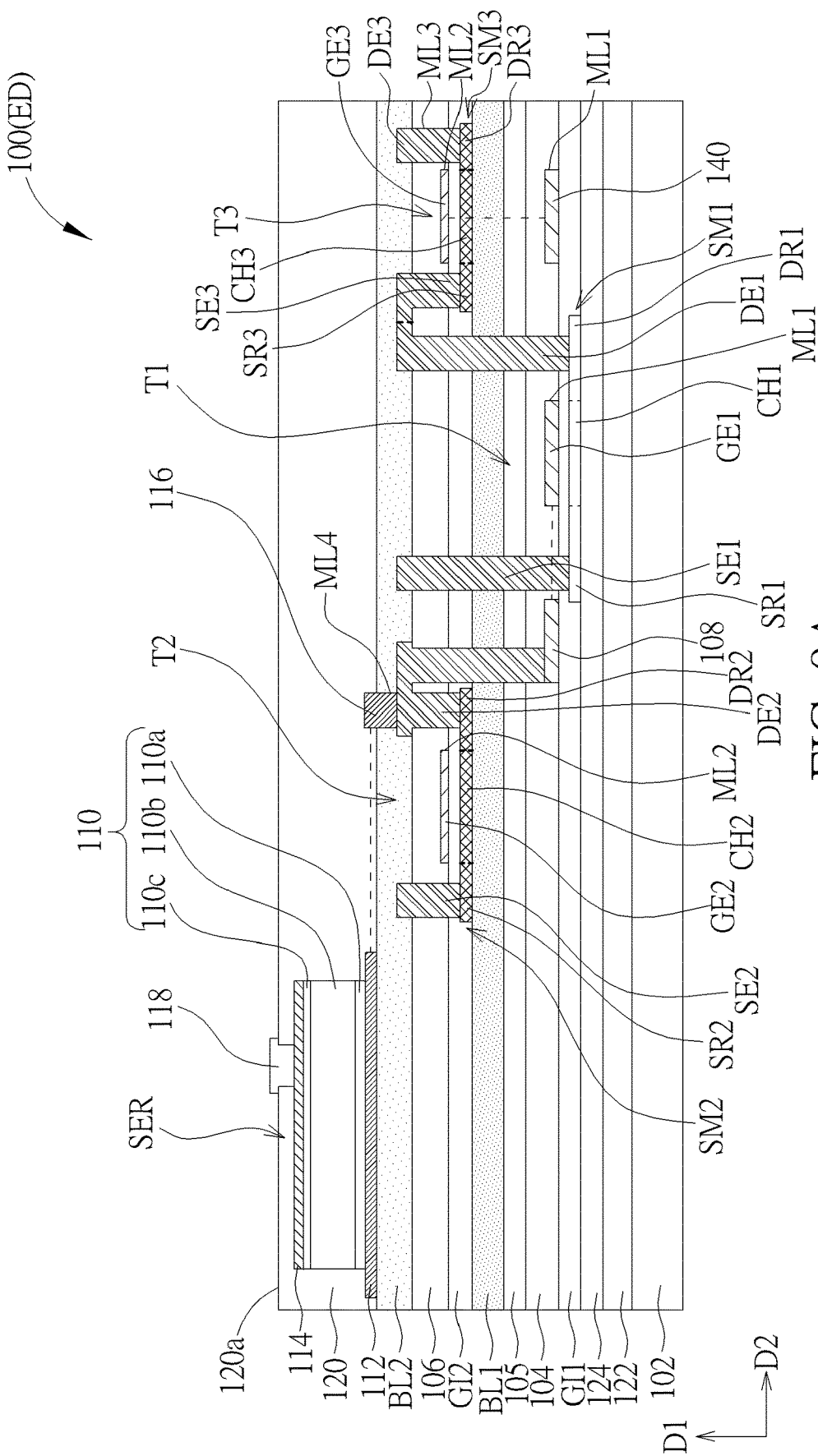
FIG. 9(A) is a partial cross-sectional diagram of an X-ray detection device according to an eighth embodiment of the present disclosure.
Figure 9B:
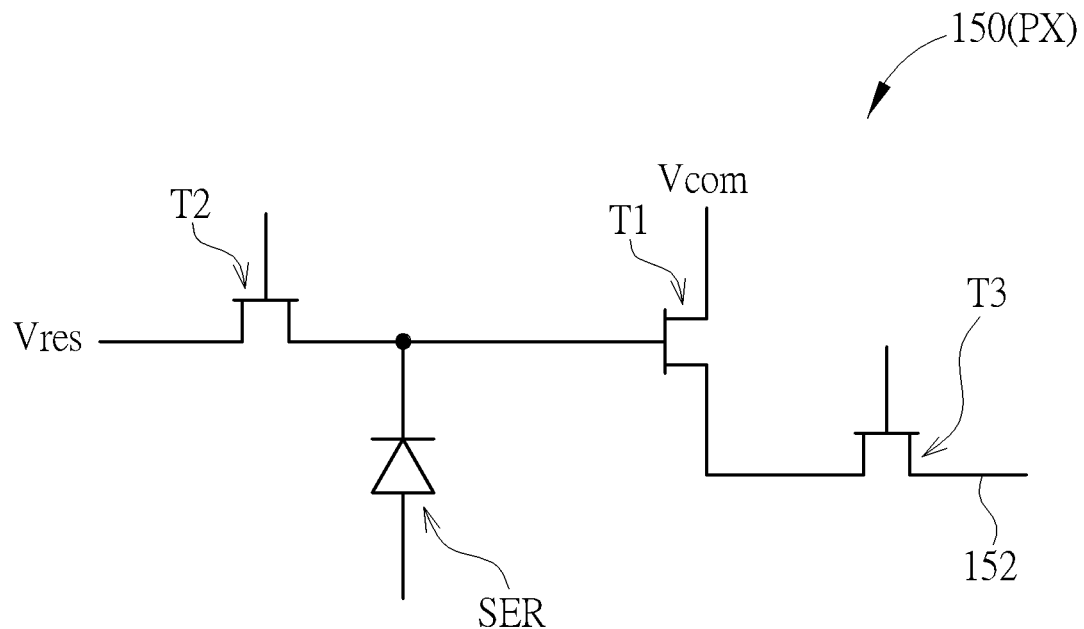
FIG. 9(B) is an equivalent circuit diagram of one sensing pixel PX of the X-ray detection device shown in FIG. 9(A).

Referring to FIG. 9(A) and FIG. 9(B), FIG. 9(A) is a partial cross-sectional diagram of an X-ray detection device according to an eighth embodiment of the present disclosure, and FIG. 9(B) is an equivalent circuit diagram of one sensing pixel PX of the X-ray detection device shown in FIG. 9(A). The third transistor T3 includes a gate GE3, a channel region CH3, a source region SR3, and a drain region DR3. The source region SR3 and the drain region DR3 may be the source and drain of the third transistor T3 respectively. The channel region CH3, the source region SR3, and the drain region DR3 may be formed by a semiconductor SM3, wherein the channel region CH3 is overlapped with the gate GE3. For example, in the embodiment shown in FIG. 9(A), a portion of the third conductive layer ML3 may be electrically connected to the source region SR3 and the drain region DR3 through two via holes to form the source electrode SE3 and the drain electrode DE3 respectively. In other words, the source electrode SE3 and the drain electrode DE3 penetrate through the second gate insulating layer GI2 and the second insulating layer 106 to connect with the source region SR3 and the drain region DR3 of the semiconductor SM3. The semiconductor SM3 of the third transistor T3 may include silicon semiconductor, metal oxide semiconductor, other suitable materials, or a combination of the materials mentioned above, but the present disclosure is not limited thereto. The silicon semiconductor and metal oxide semiconductor of the material of the semiconductor SM3 may refer to the above descriptions of the first transistor T1 and the second transistor T2, for instance, and will not be repeated. As an example, the semiconductor SM3 of the third transistor T3 in this embodiment is a metal oxide semiconductor, but not limited thereto. The third transistor T3 may include a bottom-gate type transistor, a top-gate type transistors, a double-gate type transistor, or a combination of the above-mentioned transistors, and the present disclosure is not limited thereto. The gate GE3 of the third transistor T3 and the gate GE2 of the second transistor T2 may both be formed by the second conductive layer ML2, and the semiconductor layers of the third transistor T3 and the second transistor T2 (i.e., the semiconductor SM3 and the metal oxide semiconductor SM2) may be formed by the same process steps. The source electrode SE3 and drain electrode DE3 corresponding to the third transistor T3 and the source electrode SE2 and drain electrode DE2 corresponding to the second transistor T2 or the source electrode SE1 and drain electrode DE1 corresponding to the first transistor T1 may be formed by the same third conductive layer ML3, but not limited thereto. The source electrode SE3 may be electrically connected to the drain electrode DE1 directly, but not limited thereto. Furthermore, the first conductive layer ML1 may further selectively include a gate 140 disposed between the gate GE3 and the substrate 102, and the gate 140 may be electrically connected to the gate GE3. Both of the gate 140 and gate GE3 may serve as the gate of the third transistor T3. For example, the gate 140 may be the lower gate electrode, the gate GE3 may be the upper gate electrode, and one of the gate 140 and the gate GE3 may be electrically connected to the control line to switch on/off the third transistor T3. The gate 140 in this embodiment may be formed by the first conductive layer ML1 together with the gate GE1, and when the gate 140 includes an opaque material, it may also be used as a light-shielding element to reduce or lower the incident light from the lower side of the substrate 102, reducing the influence of light on the semiconductor SM3. However, the arrangement position of the gate 140 and its formation film of the present disclosure are not limited to those shown in FIG. 9(A). In a variant embodiment, the gate 140 may be, for example, disposed between the first barrier layer BL1 and the third insulating layer 105 or disposed between the third insulating layer 105 and the first insulating layer 104, and formed by other conductive layers, but the present disclosure is not limited to the above.

The equivalent circuit 150 of one sensing pixel PX shown in FIG. 9(B) substantially corresponds to the elements shown in FIG. 9(A), wherein the second transistor T2 may serve as a reset element in the sensing pixel PX, its source may be supplied with a reset voltage Vres, and its drain and the bottom electrode of the sensor SER are electrically connected to the gate of the first transistor T1. The first transistor T1 may serve as an amplifying element in the sensing pixel PX, used as an amplifier, its source may be provided with a common voltage Vcom or a working voltage, and the drain of the first transistor T1 may be electrically connected to the source of the third transistor T3. The third transistor T3 may serve as a readout element in the sensing pixel PX, wherein the drain of the third transistor T3 may be electrically connected to a signal readout line 152 or a signal readout unit (not shown), and the signal readout line 152 is capable of outputting the output signal amplified by the first transistor T1, that is, the output current Id for the signal reading unit to perform signal analysis.

According to the present disclosure, the second transistor T2 serving as the reset element may include a metal oxide semiconductor, which has the advantages of low leakage and/or accurate zeroing, thus improving the detection accuracy of the sensing pixel PX to the light intensity, such as the metal oxide semiconductor SM2 shown in FIG. 9(A). In another aspect, the first transistor T1 may include a silicon semiconductor, and the third transistor T3 may include a metal oxide semiconductor or a silicon semiconductor. In the structure shown in FIG. 9(A), the active layer of the first transistor T1 is, for example, a silicon semiconductor SM1. Since the electron mobility of the silicon semiconductor SM1 is higher, the signal-to-noise ratio may be raised, thereby improving detection sensitivity of light; and the active layer (i.e., the semiconductor SM3) of the third transistor T3 is, for example, a metal oxide semiconductor, which is capable of forming a transistor with low leakage current and is capable of reducing the error rate of reading signals.

Figure 10:
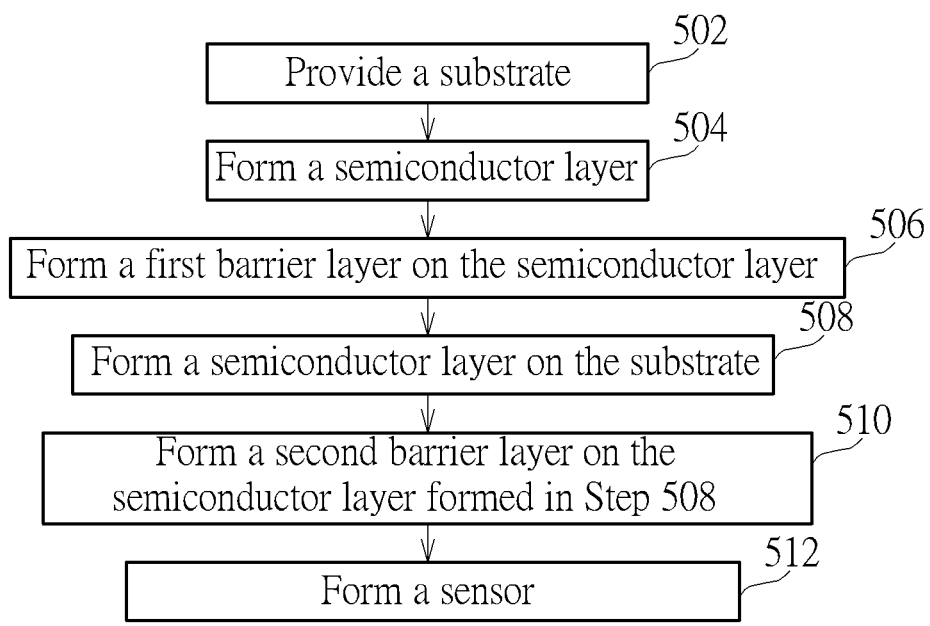
FIG. 10 is a schematic diagram of process flow of the fabrication of the X-ray detection device according to the present disclosure.

Referring to FIG. 10, FIG. 10 is a schematic diagram of process flow of the fabrication of the X-ray detection device according to the present disclosure. According to the present disclosure, the fabrication method of the X-ray detection device 100 may substantially include the following steps:

Step 502: Provide a substrate. For example, the substrate 102 is provided as mentioned in the foregoing embodiments.

Step 504: Form a semiconductor layer. For example, a patterned silicon semiconductor SM1 is formed on the substrate 102, wherein the pattern of the silicon semiconductor SM1 may correspond at least to the active region of the first transistor T1 to be fabricated.

Step 506: Forma first barrier layer on the semiconductor layer. For example, the first barrier layer BL1 is formed on the silicon semiconductor SM1, wherein before the formation of the first barrier layer BL1, the first gate insulating layer GI1, the patterned first conductive layer ML1, and the first insulating layer 104 may be formed on the silicon semiconductor SM1, but not limited thereto.

Step 508: Form a semiconductor layer on the substrate. For example, after forming the first barrier layer BL1, the patterned metal oxide semiconductor SM2 is formed on the substrate 102, wherein the pattern of the metal oxide semiconductor SM2 may correspond to at least the active region of the second transistor T2 to be fabricated. In some embodiments, the metal oxide semiconductor SM2 in this step may be formed on the first barrier layer BL1 formed in Step 506, but not limited thereto.

Step 510: Form a second barrier layer on the semiconductor layer formed in Step 508. For example, the second barrier layer BL2 is formed on the metal oxide semiconductor SM2, wherein before the formation of the second barrier layer BL2, the second gate insulating layer GI2, the patterned second conductive layer ML2, the patterned second insulating layer 106, and the patterned third conductive layer ML3 may be formed on the metal oxide semiconductor SM2, but not limited thereto.

Step 512: Form a sensor. For example, the sensor SER is formed on the second transistor T2, and the sensor SER may include a photodiode, but not limited thereto.

In the above steps, plasma enhanced chemical vapor deposition (PECVD) process, plasma enhanced atomic layer deposition (PEALD) process, or metal organic atomic layer deposition (MOALD) process may be used to form the first barrier layer and the second barrier layer. SiH4 gas may be introduced during the process, and a radio frequency (RF) power generator may be used as a plasma source. In some embodiments, a first SiH4 parameter in the first barrier layer process may be smaller than a second SiH4 parameter in the second barrier layer process. The above-mentioned SiH4 parameter includes, for example, the gas flow rate per unit time of SiH4, wherein when the gas flow rate per unit time of SiH4 is higher, the hydrogen concentration of the formed film becomes higher. For example, the flow rate of SiH4 of the first barrier layer ranges from 200 to 800 standard cubic centimeters per minute (sccm), such as 200 sccm, 300 sccm, 400 sccm, 600 sccm, or 800 sccm; the flow rate of SiH4 of the second barrier layer ranges from 801 to 2400 sccm, such as 1000 sccm, 1200 sccm, 1600 sccm, or 2400 sccm, but the present disclosure is not limited to the above. In some embodiments, a first RF power parameter in the first barrier layer process may be greater than a second RF power parameter in the second barrier layer process, and the above-mentioned RF power parameter is proportional to the plasma intensity. When the plasma intensity is greater, the denseness of the formed film is higher, and the density of the formed film layer is higher.

As can be seen from the above, the X-ray detection device of the present disclosure includes two transistors and a sensor, wherein the two transistors may respectively include semiconductor layers of different materials, for example, one is a silicon semiconductor, and the other one is a metal oxide semiconductor. In addition, a barrier layer is disposed between the two semiconductor layers of different materials, and another barrier layer may also be disposed between the sensor and the transistors. By disposing the barrier layers and adjusting the process parameters and/or film parameters of the two barrier layers, protective functions may be provided to the semiconductor layers, or the electrical performance of the semiconductor layers may be improved. For example, the diffusion of hydrogen ions into the metal oxide semiconductor can be reduced, and/or the property of the silicon semiconductor can be improved, thereby improving the electrical performances of different transistors respectively. In another aspect, the transistors including different semiconductor materials may be selected as a reset element, an amplifying element, or a readout element, or other functional transistor in the sensing pixel based on their characteristics, so as to improve the sensing accuracy of the sensing pixel.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An X-ray detection device, comprising:
   a substrate;
   a first transistor disposed on the substrate and comprising a silicon semiconductor;
   a second transistor disposed on the substrate and comprising a metal oxide semiconductor;
   a sensor disposed on the first transistor and the second transistor and electrically connected to the first transistor and the second transistor;
   a scintillator disposed on the sensor;
   a first barrier layer disposed between the first transistor and the second transistor; and
   a second barrier layer disposed between the second transistor and the sensor.

2. The X-ray detection device as claimed in claim 1, wherein a hydrogen concentration of the second barrier layer is greater than a hydrogen concentration of the first barrier layer.

3. The X-ray detection device as claimed in claim 2, further comprising an insulating layer disposed between the first transistor and the substrate, and a hydrogen concentration of the insulating layer is greater than the hydrogen concentration of the second barrier layer.

4. The X-ray detection device as claimed in claim 1, wherein a density of the first barrier layer is greater than a density of the second barrier layer.

5. The X-ray detection device as claimed in claim 1, wherein a thickness of the first barrier layer is less than a thickness of the second barrier layer.

6. The X-ray detection device as claimed in claim 1, wherein a material of the first barrier layer comprises silicon oxide.

7. The X-ray detection device as claimed in claim 1, wherein a material of the second barrier layer comprises silicon oxide, silicon nitride, or a combination thereof.

8. The X-ray detection device as claimed in claim 1, wherein the sensor is a P-intrinsic-N (PIN) photodiode.

* * * * *